(12) United States Patent
Savage et al.

(10) Patent No.: US 8,344,553 B1
(45) Date of Patent: Jan. 1, 2013

(54) HIGH RELIABILITY LOW JITTER PULSE GENERATOR

(75) Inventors: Mark E. Savage, Sandia Park, NM (US); Brian S. Stoltzfus, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 366 days.

(21) Appl. No.: 12/793,331

(22) Filed: Jun. 3, 2010

(51) Int. Cl.
*H03K 3/00* (2006.01)
(52) U.S. Cl. ........................................ 307/106
(58) Field of Classification Search ............ 307/106
See application file for complete search history.

(56) References Cited

U.S. PATENT DOCUMENTS

| | | | | |
|---|---|---|---|---|
| 5,641,935 | A * | 6/1997 | Hunter et al. | 102/206 |
| 8,026,772 | B2 * | 9/2011 | Stark | 333/13 |
| 2009/0079347 | A1 * | 3/2009 | Stark | 315/39 |
| 2010/0001644 | A1 * | 1/2010 | Stark et al. | 315/39 |

OTHER PUBLICATIONS

Martin, T. H., "Pulsed Charged Gas Breakdown", 5th IEEE International Pulsed Power Conference, Arlington, VA, 1985.
Pendleton, W. K., et al., "Investigation of a Laser Triggered Spark Gap", Rev. Sci. Instrum. vol. 36 1965, pp. 1546-1559.
Savage, M. E., et al., "An Overview of Pulse Compresion and Power Flow in the Upgraded Z-Pulsed Power Driver", IEEE 2007, pp. 979-984.
Savage, M. E., et al., "High Reliability Low Jitter 80 k V Pluse Generator", Phys. Rev. ST Accel. and Beams,12, 2009, pp. 080401-1 to 080401-13.
Savage, M. E., "Trigger Generator Performance", Personal Communication to J. Maenchen, May 4, 2004.
Small, L. L., et al., "Low-Jitter, Low-Inductance, Electrically Trigered Spark Gap", Rev. Sci. Instrum. 55(7), 1984, Jul. 1984, pp. 1084-1089.
Wilson, M. J., et al., "A High Voltage, High Curent, Low Inducance, Pressurised Switch for Parallel Plate, Pulsed Power Systems", J. Phys. E: Sci Instrum, vol. 14, 1981, 1981.
Woodworth, J. R., at al., "Laser Triggering of a 500-kV gas-filled Switch: A Parametric Study", J. Appl. Physics, vol. 56, 1984, pp. 1382-1386.
Woodworth, J. R., et al., "UV Laser Triggering of High-Voltage Gas Switches", J. Appl. Physics, vol. 53, 1982, pp. 4734-4739.
Nitta, "Area Effect of Electrical Breakdown in Compressed SF6," Mitsubishi Electric Corporation, Amagasaki, Japan, Paper T73-449-6, recommended and approved by IEEE Switchgear.

* cited by examiner

*Primary Examiner* — Adi Amrany
(74) *Attorney, Agent, or Firm* — Peacock, Myers P.C.

(57) ABSTRACT

A method and concomitant apparatus for generating pulses comprising providing a laser light source, disposing a voltage electrode between ground electrodes, generating laser sparks using the laser light source via laser spark gaps between the voltage electrode and the ground electrodes, and outputting pulses via one or more insulated ground connectors connected to the voltage electrode.

20 Claims, 8 Drawing Sheets

HIGH RELIABILITY LOW JITTER PULSE GENERATOR

STATEMENT REGARDING FEDERALLY SPONSORED RESEARCH OR DEVELOPMENT

The Government has rights to this invention pursuant to Contract No. DE-AC04-94AL85000 awarded by the U.S. Department of Energy.

CROSS-REFERENCE TO RELATED APPLICATIONS

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to methods and apparatuses for pulsed power switching.

2. Description of Related Art

Switching can be considered to be the essence of pulsed power. Time accurate switch/trigger systems with low inductance are useful in many applications. It can be challenging to generate high voltage (more than 50 kilovolts) into impedances less than 10Ω, from a low voltage control signal with a fast rise time and high temporal accuracy. The required power amplification is large, and is usually accomplished with multiple stages. The multiple stages can adversely affect the temporal accuracy and the reliability of the system. In certain applications, a highly reliable and low jitter trigger generator is required.

The large investment in certain applications demands low prefire probability and low jitter simultaneously. For example, a system described herein is based on a 100 kV DC-charged high-pressure spark gap, triggered with an ultraviolet laser. The system uses a single optical path for simultaneously triggering two or more adjacent, axially spaced parallel switches, allowing lower inductance and electrode erosion with a simple optical system. Performance of the system includes 6 ns output rise time into 5:6Ω, 550 ps one-sigma jitter measured from the 5 V trigger to the high voltage output, and misfire probability less than $10^{-4}$.

The present invention provides a unique switch geometry coupled with a low-inductance capacitive energy store. The system provides a fast-rising high voltage pulse into a low impedance load.

BRIEF SUMMARY OF THE INVENTION

The present invention is of an apparatus and a method for generating pulses, comprising: disposing a voltage electrode between ground electrodes; forming laser spark gaps between the voltage electrode and the ground electrodes; and connecting one or more insulated ground connectors to the voltage electrode. In the preferred embodiment, the apparatus is axisymmetric, most preferably wherein the laser spark gaps are activated with an on-axis laser beam. Two or more insulated ground connectors are provided with an isolating inductor. Laser light is provided to the laser spark gaps via a focal lens, most preferably with a focal lens length between about 300 and 700 mm. The thickness of the voltage electrode proximate the laser spark gaps can be about 1 mm and the width of the laser spark gaps can be about 7 mm. A ferromagnetic blocking core can be employed. The invention provides a less than about a $10^{-4}$ misfire probability and about a 550 ps jitter or better.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1 has a singled-sided output;

FIG. 2 has fully symmetric two-sided output with blocking ferrite;

DETAILED DESCRIPTION OF THE INVENTION

The present invention is of a method and apparatus for high reliability but low jitter pulse generation. The present specification will discuss possible methods and means for accomplishing that result, as well as a preferred embodiment of such method and apparatus, with discussion guided by a particular example application/system.

Pulsed-power high voltage systems often use stages of pulse amplification to increase a signal to levels needed to trigger a subsequent stage, ultimately reaching the desired voltage and power level. This is certainly true for megavolt systems in which the initiating signal is of the order of ten volts from a computer-controlled system. The initial stages of the trigger process are often the most problematic because of the lower electric fields (below the electron emission threshold of order 30 kV/mm with reasonable gaps and electrode sharpness) in low voltage switches. On many large single-shot drivers, reliability and time accuracy of the entire system (and therefore each stage) are critical.

As an example, an improved primary trigger generator for a 28 MJ facility was needed. The facility demands superior time accuracy from each part of its trigger system for synchronizing with fast diagnostics on a one-nanosecond time scale. The primary trigger generator is required to be charged to its ultimate voltage for time periods up to several minutes, then accept a five-volt trigger signal and produce a fast-rising high voltage output, with one-nanosecond or less temporal uncertainty. The substantial investment in each experiment on such a large facility makes the misfire rate an important factor, and the prefire and no-fire probabilities of $10^{-4}$ or lower are required. Because of the large physical size of the facility, the output pulse from the primary trigger generator operates into multiple (nine) high voltage 50Ω cables with transit time much longer than the pulse duration. In this example application, the primary trigger generator thus effectively operates into a 5.56Ω resistive load.

Because of the stringent performance and reliability requirements for this system, there were no suitable commercially available pulse generators. The load impedance necessitates a relatively low system inductance (less than 22 nH total) for output rise times less than ten nanoseconds. The low tolerance to misfires and low acceptable jitter requires a stable switch with a strong triggering mechanism.

The present invention meets the rise time, amplitude, jitter, and reliability requirements for the primary trigger generator of the example system. The invention uses a low-inductance switch, capacitors, and output connectors (14 nH total) with reliable operation at 100 kV DC charge, and a strong laser triggering mechanism. The invention operates routinely with no conditioning (although the laser requires about 15 minutes for temperature stabilization of the nonlinear crystals), and has subnanosecond (1 standard deviation) jitter and less than $10^{-4}$ prefire probability at the same time. The system delivers more than one gigawatt into the 5:56Ω resistive load with six-nanosecond 10%-90% rise time. The maintenance interval is of the order of about 10,000 shots at full voltage and usually involves cleaning or replacement of the final focusing lens.

Appreciable challenges are involved in building fast rise time, low jitter pulse generators. While commercially available multi-output 100 kV trigger systems have been built in the past, they did not meet the jitter or rise time requirements of the primary trigger generator for the example system, and were too unreliable. In some situations, particularly as to large drivers with considerable stored energy, an extremely reliable primary trigger generator is crucial, to prevent inadvertent system firing, or failure to fire. Furthermore, in large drivers, system faults, and even normal operation, can apply appreciable external voltages and currents to the trigger unit. The primary trigger generator must tolerate forward and reverse voltages at least as high as the charge voltage, and currents and late-time current at levels as high as the normal output, without damage.

Because no commercial system would meet the requirements of the example system, several technology options to build the pulser system might be considered. The basic technology options to be considered are solid-state switches, high vacuum electron tubes, low pressure discharge devices, electrically triggered high-pressure spark gaps, and laser-triggered high-pressure spark gaps. Evaluation of the strengths and weaknesses of these technologies lead to the development of the invention using a laser triggered high pressure spark gap.

A common technique used in some systems to generate high output voltages would be to use multiple stages of voltage amplification. These stages would include solid state, thyratron, and spark gap switches for the final output switch. Commercially available 100 kV DC-charged spark gaps have 40 nH inductance, requiring multiple parallel switches to achieve the desired rise time. The number of stages (series and parallel) affects the total jitter, reliability, and misfire probability of the system.

Laser triggering provides a convenient way to form a plasma channel in the electrically stressed region of a spark gap, in a period of time determined by the laser duration, which can be almost arbitrarily fast with short pulse lasers. Laser-triggered switches have used both plasma formation on an electrode and plasma formation in the bulk insulator for initiating. Early laser triggering experiments used a long wavelength laser focused on one electrode for plasma formation and switch initiation. For the lowest jitter, it is desirable to create plasma in the bulk switch dielectric (in most cases high-pressure gas). This typically requires a shorter wavelength laser than plasma formation on an opaque switch electrode, but provides much larger field enhancement and therefore lower switch jitter. Moderately high-power, commercial pulsed ultraviolet lasers allow millimeter-length plasma channel creation in high-pressure gas, in a few nanoseconds. The plasma channel created from a cylindrical laser beam focused in the switch region provides a needle-shaped plasma with large field enhancement. The large field enhancement provides fast and accurate switch closure.

A large body of work exists on laser-triggered spark gap systems that switch with nanosecond accuracy. Much of the work has been on systems of 10 kV to drive optical Pockels cells, or in systems greater than 200 kilovolts for high peak power particle beam or x-ray generators. Despite the cost and complexity issues with high-power, fast-pulsed lasers, the advantages of laser triggering in some applications are considerable.

Sulfur hexafluoride gas has a relatively high electrical breakdown strength, and also has a relatively low threshold for plasma formation from ultraviolet light. This conveniently maximizes spark gap holdoff voltage (for reduced inductance) and minimizes the laser energy required for triggering. The availability of relatively low-cost, frequency-quadrupled (266 nm) solid-state Nd:YAG lasers with low inherent jitter makes a laser-triggered system more practical than in the past. Modern commercial Q-switched lasers are available with subnanosecond jitter from the arrival of the input 5 V pulse to the coherent light output, delivering 25 mJ in a three-to five-nanosecond pulse. Such lasers have been used for several years to control the multimegavolt gas switches in pulsers, and so have a history of performing well in a pulsed-power laboratory. The 25 mJ lasers used in this work can generate visible sparks of 15 mm length and 0:1 mm diameter with an f24 system (300 mm focal length lens and a 12.5 mm diameter beam) with no applied electric field.

In most pulsed-power systems, the important performance parameters of a pulse generator are the temporal jitter of the output, the probability of a misfire, the output pulse amplitude and rise time, and the system maintenance interval.

To meet the system goals in the harsh mechanical and electromagnetic environment adjacent to the example high current driver, a low-inductance pulse generator is preferred in the present invention, with a high-pressure gas insulated, low-inductance laser-triggered switch. The system uses laser triggering in a nominally uniform electric field gap geometry. The switch uses two parallel arc channels to minimize inductance, reduce channel effective resistance, and reduce electrode arc damage. A single arc channel at $SF_6$ pressures less than 500 kPa would be too inductive to meet the rise time requirement. Multiple parallel switches would result in a larger and more complicated system.

Figure 1:
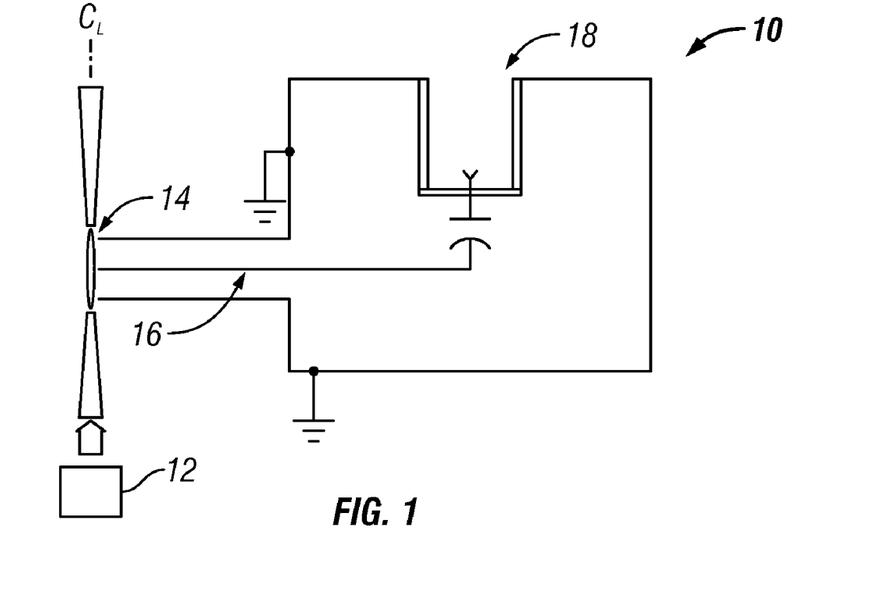
FIGS. 1 and 2 are schematic diagrams of the two-channel laser-triggered pulse generator of the invention; the switch center plate is charged to high voltage; current flows in two parallel laser-created spark channels to the grounded electrodes; the pulser system is axisymmetric (with the laser beam on axis) for lowest inductance.
Figure 2:
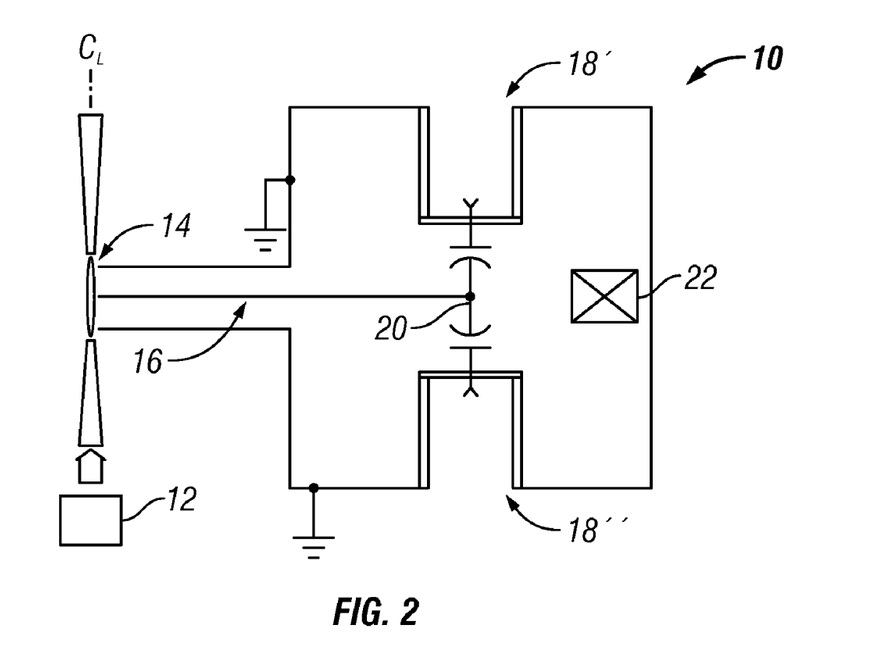
Figure 3:
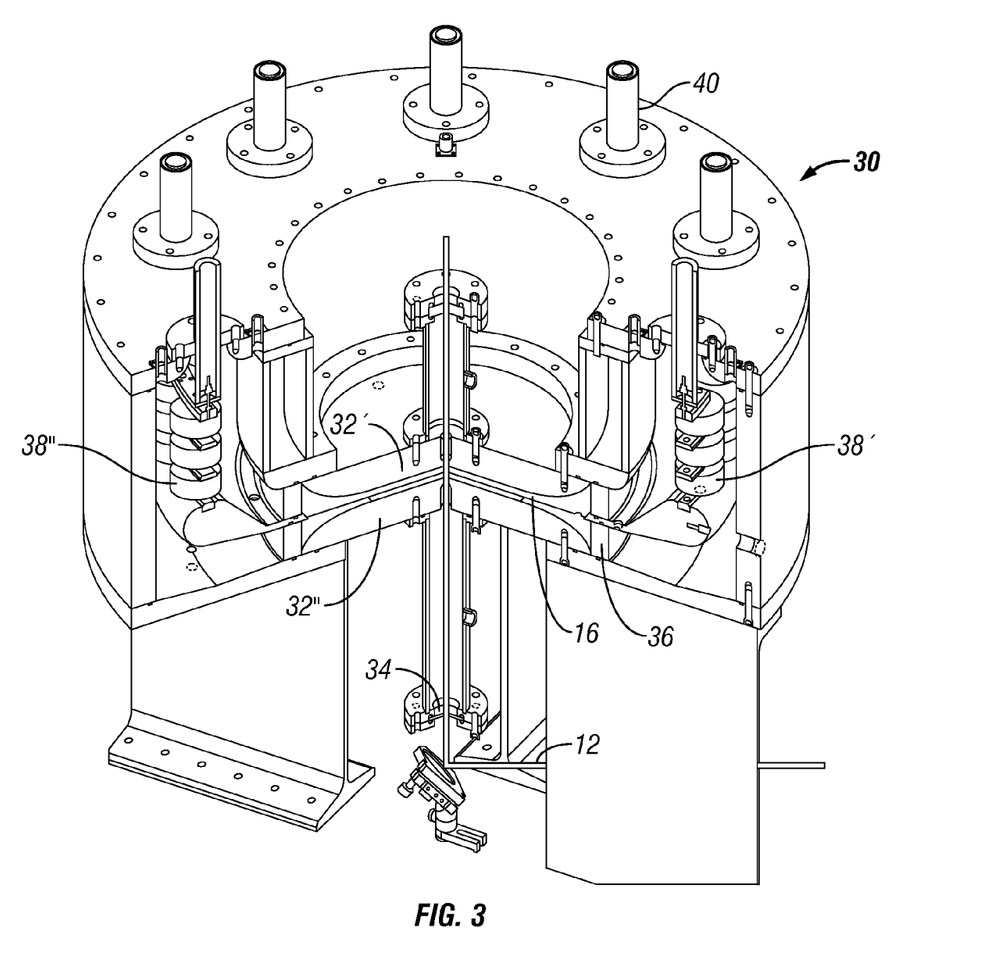
FIG. 3 is a cut-away perspective view of the laser-triggered low-inductance switch and pulse generator system of the invention; the electrode gap in the center is, for example, 7 mm.

FIGS. 1 and 2 show conceptual diagrams of the trigger pulser 10 of the invention. FIG. 1 shows the basic switch concept as implemented, comprising laser beam 12, laser spark 14, high voltage electrode 16, and insulated output connector 18. FIG. 2 shows a fully symmetric version of the switch with a set of output connectors 18',18" for each switch half, as well as a ferrimagnetic blocking core 22. FIG. 2 also shows an isolating inductor 20 to force current sharing between channels. FIG. 3 shows a sectional view of the preferred system 30 as developed, including ground electrodes 32',32", focusing lens 34, oil/gas interface 36, energy storage capacitors 38',38", and output connectors 40. In the system tested, the output feeds are discrete axial conductors; power can flow from one switch half to the other. The ferrimagnetic core would prevent current flow from the upper output connector through the lower switch channel if one side of the switch closed before the other. If the jitter between the switch halves is small compared to the wave transit time between switch halves (as in the case of the example system described here), the additional isolation is not needed.

During the initial design of the example system, it was not known how well the channels would share current for the duration of the output pulse. The isolating inductor has not been necessary or tested for the example system, although it may potentially reduce sensitivity to the location of the laser produced plasma by allowing more time before voltage falls on the later switch half. The required volt-second product would be determined by the timing jitter between the switch halves; relatively small cores of a few square cm cross sectional area would be adequate for the worst jitter observed.

The switch body is preferably about 873 mm in diameter. A cross-linked polystyrene insulator with 400 mm inner diameter separates the high-pressure gas from the mineral oil insulated capacitor section. The capacitors are 2.6 nF, 40 kV strontium titanate ceramic units in a stack of three parallel sets of three series units, for a total of 2.6 nF at 120 kV rated voltage for each of the nine output cables (130 ns time constant). At 83% rated voltage, the capacitors maintain 95% of their rated capacitance. There are 81 capacitors total in the system. Grading resistors (1 GΩ) shunt the capacitors to ensure even voltage distribution. The electric field in the oil insulated DC-charged section is maintained at or below 4 kV/mm at 100 kV charge voltage. The energy storage capacitors form the center conductor of a triaxial oil insulated feed, which allows lower inductance than a coaxial feed. Because of its azimuthally distributed nature and the relatively large distance from the axis, the total inductance of the capacitor set is 2 nH. The current through the bottom switch flows on the outer feed gap. The lower impedance of the larger diameter outer feed tends to offset the longer path length to the lower switch. The output connectors are dry; the insulating oil does not contact the output cables. No breakdowns have been observed at the output cable connectors in the ten thousand full voltage shots performed.

Because the system has two grounded terminals with a high voltage midplane electrode, the system does not require insulating rods in tension. The cross-linked polystyrene gas-oil insulators are preloaded by deflection of the top metal plate of the housing to withstand the 244 kN pressure force at 860 kPa rated pressure. The balanced power flow design also eliminates stray electromagnetic fields from the charging and closure of the switch. Except for the output cables and the charge cable, the unit can be completely electrically isolated, and is completely enclosed.

The electrode materials are all 304L stainless steel. Replaceable arc region inserts were used on the prototype system but were judged unnecessary for the numbers of shots to be encountered in the example system (<=105). A thin (1 mm) midplane plate with a hole is charged to high voltage. The optical path penetrates one grounded electrode, through the hole in the midplane, then through a hole in the opposite grounded electrode. The optical focus is close to the middle of the midplane electrode. The focused laser beam creates a plasma channel in the gas extending from the high voltage midplane electrode towards both grounded electrodes. The focal point axial position is fine adjusted with a 3× optical beam expander with divergence adjustment. The transported beam is expanded for reduced fluence on the optics, and for the divergence adjustment. In practice, the beam is adjusted until the top and bottom switches close at the same time, and the currents are the same. Current is measured with derivative-responding flux loops mounted inside the top lid. Some leakage through the space between the nine output cables requires correction to remove the resultant crosstalk, which is of the order of 10%. Where the indicated currents are equal within 15%, the correction for crosstalk is negligible.

Switch inductance and channel resistance both promote current sharing between the two channels. For times comparable to an inductive time constant, which is 20 nanoseconds with 20 nH on each side of the switch, and 1Ω channel resistance, inductance largely determines current sharing. The inductances on each side of the switch are close to equal; the lower switch feed has a longer transit length, but lower impedance. At later times, channel resistance is the dominant factor in current sharing. Because the spark channel properties are dominated by the electrostatic energy spent heating the channels in the first fractions of a nanosecond, the channels are likely to be similar in conductivity. If the channel resistances are similar, that resistance balance determines current sharing at later times.

The switch uses a single laser beam to create a laser spark closing two parallel spark gap switches. Because there is no appreciable mutual inductance between the switches, this immediately halves the inductance of the entire switch system. The 25 mJ laser pulse provides enough energy to create a plasma channel with adequate extent to close both switches with a 300 mm focal length lens and a 12.5 mm diameter laser beam. Shorter focal length systems have higher specific optical energy density in a shorter and more intense spark; longer focal lengths tend to make longer but more tenuous sparks. There are also more shot to shot spark length variations with longer focal lengths. The optimum is likely in the range 300 to 700 mm for the laser employed in the example system. The laser spark must extend most of the way through two 7 mm gaps and the 1 mm thick center plate for closing both gaps with subnanosecond simultaneity. Concepts to refocus light exiting the switch, or extending the laser spark with aspheric optics, could reduce the required laser energy. Because the laser beam path exits the switch, it is possible to monitor the optical energy not dissipated or dispersed in the switch focus.

About half of the incident ultraviolet laser energy exits the switch coherently through the opposite grounded electrode. Most of the lost light is presumably scattered, so the energy available for ionization of the switch gas is 0.5 millijoules per mm or less. Assuming a spark column 0.1 mm in diameter and 15 mm long, the average laser energy dissipated is about 2:5 eV/molecule average at 400 kPa pressure. The laser produced plasma is thus weakly ionized and relatively cold. The absorbed optical energy (about 3:5 mJ) is small compared to the electrostatic energy stored in the switch electrode region (about 800 mJ), so substantial resistive heating occurs to create significant conductivity. The laser spark simply initiates the plasma channel; it is electrostatic energy that actually forms the low resistance channel that carries significant current.

As an alternative to the design discussed above, a single laser beam could be split optically and routed to multiple independent switches. However, a beam splitting system would have considerably more optical components and would be more difficult to align. Each antireflection coated optical surface reduces the beam energy several percent. The use of a single laser spark to close both switches reduces the complexity of the optical path, and reduces the number of optics surfaces that reduce energy, can get dirty, and must be aligned. With both arc channels centered on the same axis, there is negligible mutual inductance between the channels. Other work on multiple spark channels in a single switch had appreciable mutual inductance between the channels, which limited the reduction in total effective inductance.

In the switch described here, the multiple channels are preferably transit time isolated (by about five or more times greater than the switch jitter) to allow reliable closure of both channels even without the isolating inductor. Besides lower inductance, an additional benefit of multiple channels is reduced erosion. Because of the isolation between channels, the current sharing is close to uniform, so each channel carries half the total current, substantially reducing the electrode erosion. Reduced erosion is important for cleanliness inside the switch; debris can affect the insulator surfaces and the optical windows.

As noted before, there are two issues with high-pressure spark gap switch performance. At the highest pressures, the self-breakdown electric field has more variations because electrode damage and defects are larger compared to the electronegative gas shielding distance—essentially, the electrodes are more enhanced at higher pressures. The mean electric holdoff strength (V/mm/Pa) also falls at higher pressures in geometries with field enhancements, and so high pressures can be problematic for systems with nonuniform fields (as can be caused by the laser entrance holes, and arc damage). Addressing both of these issues was accomplished by using a 7 mm electrode gap to maximize the linear range of the self-break versus pressure curve, while maintaining reasonable inductance.

An initial version of the pulser of the invention had the option of 4, 6, and 8 mm gaps. As expected, the smallest gaps required the highest pressures for a given voltage holdoff. In terms of electric field, the different gaps behave similarly at low pressures. At higher pressures, the 4 mm gap self-breakdown voltage becomes sublinear with pressure, and the fractional variation in self-breakdown voltage (spread) becomes large. FIG. 3 shows the self-breakdown voltage versus pressure for 4, 6, and 8 mm in pure $SF_6$. The system was limited in total voltage, and so at the larger gaps only lower pressures could be investigated. While the smaller gap would allow lower inductance, the variations in self-breakdown voltage were deemed unacceptably high for a stable, low jitter system. For that reason, the preferred system in routine use employs 7 mm gaps, and operates at 14:3 kV/mm average field and 432 kPa pure $SF_6$. No prefires or misfires have been observed under these conditions in the course of approximately 10,000 shots.

Quantifying the prefire probability of a gas switched system such as this is useful, and can be done in at least three ways: The first and most straightforward method is to operate the system normally, and observe prefires over a number of shots. This can be time consuming because of the number of shots required for systems with $10^{-1}$ or lower prefire probability. The large number of shots may also cause significant conditioning or erosion, and so could affect the results. The second method is to operate the system at higher than normal voltage, and characterize the self-break distribution function at the operational pressure. The rest of the system must be able to tolerate the higher voltages; this can be a problem for low inductance designs where electric fields are relatively high during normal voltage operation. The results at higher than normal voltage may be pessimistic if the higher voltage introduces new switch closure modes. The third way to characterize the prefire probability is to characterize the self-breakdown distribution with smaller gaps, at normal voltage and pressure. This can be accurate if the electric fields are not affected by the gap change, which is true for nominally planar electrodes. This test method limits voltage stress to normal levels.

Figure 4:
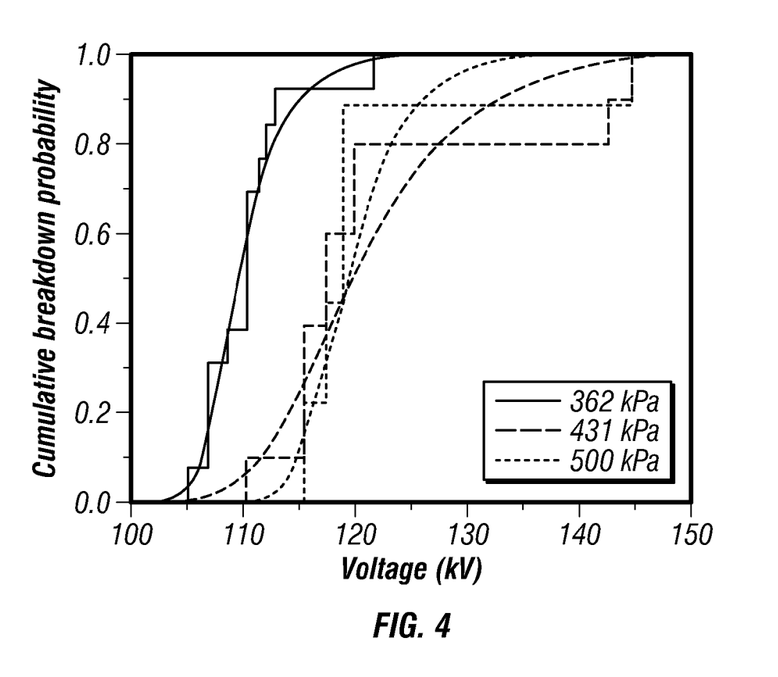
FIG. 4 is a graph of cumulative breakdown probability for 362, 431, and 500 kPa $SF_6$ pressure, generated from a largest extreme value model fit to the self-breakdown voltage data at three pressures, shown with self-break data (stairstepped); data are taken with 4 mm electrode gap, and shown scaled linearly to the operational gap of 7 mm; the calculated prefire probability at 431 kPa and 100 kV is less than $10^{-5}$.

Scaled reliability calculations were done for the preferred switch of the invention at reduced gap values. The self-breakdown data with a 4 mm gap were scaled to the operational 7 mm gap linearly. The calculations were done for three different pressures. A largest extreme value fit was chosen based on comparison of the fit quality. FIG. 4 shows the cumulative self-breakdown distribution function generated from a largest extreme value fit to the self-breakdown voltage at three pressures (362, 432, and 500 kPa). The calculated nominal voltage for 105 failure rate at 432 kPa is 101 kV; the 95% confidence interval spans the range 92 to 110 kV for 105 failure rate at that pressure. The 103 failure rate voltage range is 97 to 111 kV (95% confidence) with a nominal value of 104 kV, based on the self-break data. The median self-break voltage is 119.7 kV at 432 kPa; the switch operates reliably at 84% of the median self-break voltage. The calculations are based on a relatively small number (about ten) self-breakdown tests. The uncertainty could be reduced appreciably with a larger number of self-breakdown measurements. The largest extreme value (or Gumbel) distribution is the largest values from a set of probabilities. The largest extreme value distribution has a probability function of $$PDF(x, \alpha, \beta) = \frac{\exp\left[\exp\left(\frac{-x+\alpha}{\beta}\right) + \frac{-x+\alpha}{\beta}\right]}{\beta}$$

where $\alpha$ and $\beta$ are fitted parameters and x is the independent variable. The exponential of an exponential accounts for a distribution of failures resulting from a distribution of failure mechanisms. The largest extreme value model produces better fits when there are occasional high valued results, such as the small number of very high self-break voltages present in the data. High values can be observed in the initial tests due to pristine electrodes (the data have not been correlated with electrode life; the results are equally weighted). The presence of occasional very high voltage self-breakdowns scarcely adds to the reliability of the switch, but adds to the undesirable width of the self-break distribution. Large holdoff conditions also typically increase triggering difficulty, essentially increasing jitter.

Figure 5:
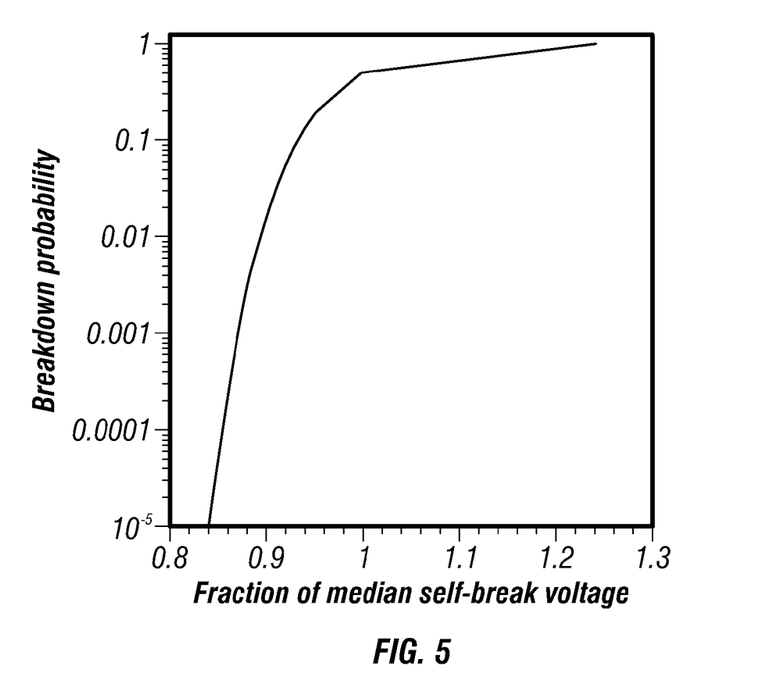
FIG. 5 is a logarithmic plot of calculated prefire probability versus fraction of median self-break voltage at 432 kPa, with 7 mm gaps, calculated from a largest extreme value fit to the measured self-break data; by definition, the breakdown probability at the median self-break voltage is 0.5.

FIG. 5 shows the calculated prefire probability from a best fit of a largest extreme value function to the self-break data at 432 kPa pressure. The data were acquired with a 4 mm gap, and scaled to the operational 7 mm gap.

Figure 6:
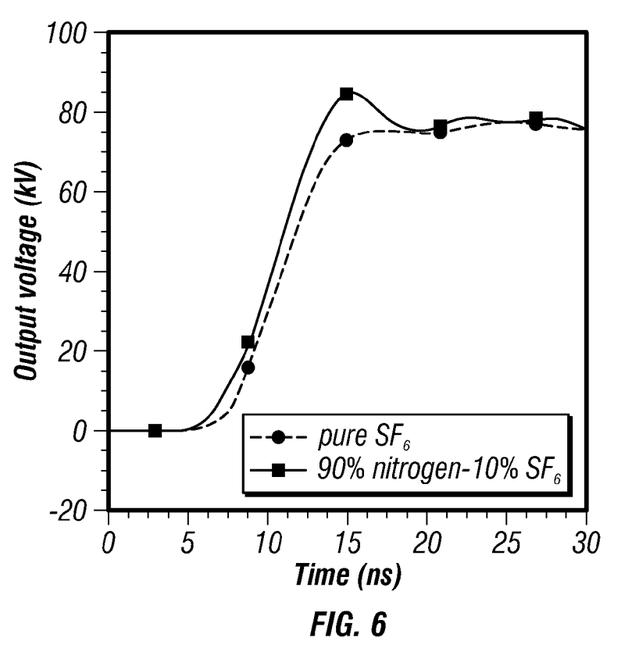
FIG. 6 is a graph of voltage output from the pulser with pure $SF_6$ (circles) and a mixture of 90% $N_2$ and 10% $SF_6$ (squares); the tests were done at the same fraction of self-break voltage, and at 100 kV DC charge.
Figure 7:
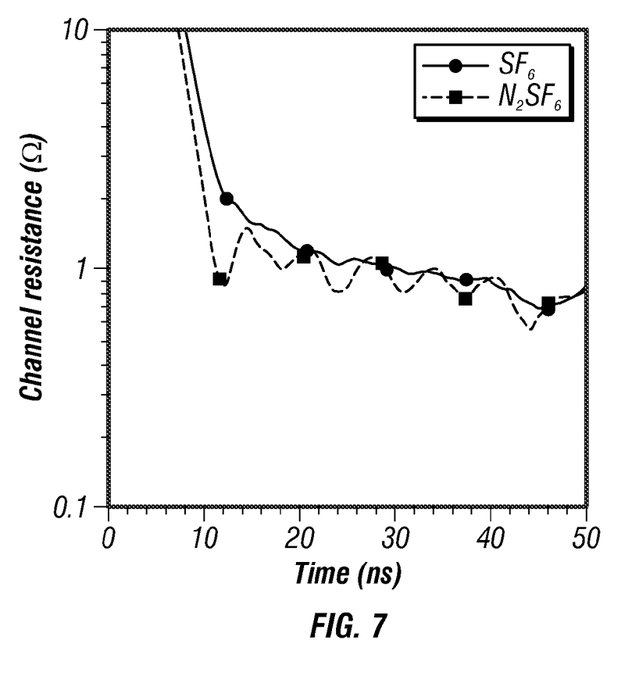
FIG. 7 is a graph of arc channel resistance for pure $SF_6$ and 90% N/10% $SF_6$ mixture.

FIG. 6 shows output voltage measured by multiplying the output current by the load impedance, for both pure $SF_6$ in the switch and 90% nitrogen with 10% $SF_6$. FIG. 7 shows the channel resistance calculated from the output voltage, the known circuit values, and the initial charge voltage. The channel resistance can be calculated from the circuit, ignoring wave transit times in the pulser:

$$R_{channel} = Z_{load} - \frac{V_0}{I} + \frac{1}{IC}\int_{-\infty}^{t} I\,d\tau + \frac{L}{I}\frac{dI}{dt}$$

where $Z_{load}$ is the external load impedance, $V_0$ is the initial DC charge voltage on the capacitor, I is the total circuit current, and L is the circuit inductance. FIG. 7 shows calculated channel resistance for the two channels with pure $SF_6$ and a 90% nitrogen, 10% $SF_6$ mixture at the same fraction of median self-break voltage. The resistance for the nitrogen mixture is significantly lower at early times, allowing somewhat higher peak voltage and faster rise time with the nitrogen mixture. The plateau resistance is similar for the two gases. This could imply that the channel expansion in the lighter mixture results in cooling and higher plasma resistivity. In this system, the spark resistance has an appreciable effect on the output amplitude.

Figure 8:
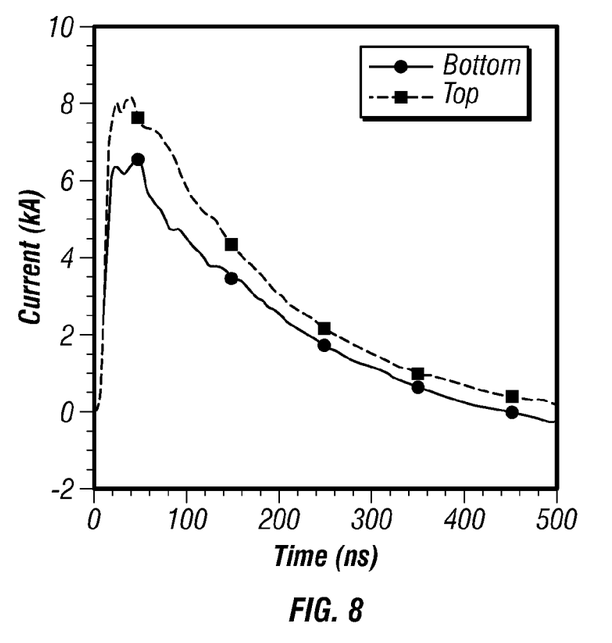
FIG. 8 is a graph of currents measured on each half of the switch system of the invention.

The channel resistance is the combined effective resistance of the two channels carrying part of the total current. FIG. 8 shows the currents measured on the top and bottom halves of the switch. Martin assumes the combined effective resistance of channels carrying equal currents to be proportional to $n^{-1/3}$. In that case, the resistance of a two-channel switch would be 79% that of a single channel. It is predicted that a lowering of total resistance would be $n^{-2/5}$, which would make the effective resistance of two channels 76% that of a single channel. Switch conductance is sublinear with the number of channels because less energy is available to heat the channel when the current is divided, so the channel is a combination of lower temperature and smaller diameter. The drop in resistance is beneficial, even though it does not scale directly with the number of channels.

Figure 9:
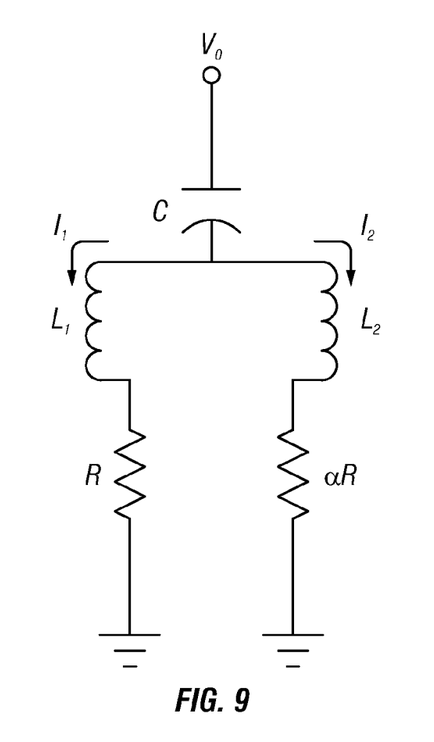
FIG. 9 is a schematic diagram of the two switch halves and the circuit model components.
Figure 10:
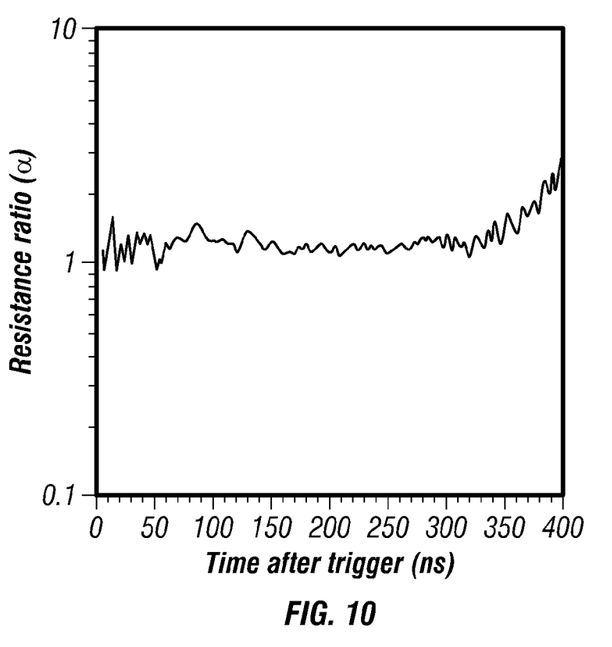
FIG. 10 is a graph of the ratio of the top channel resistance to the bottom channel resistance; the channels share current consistently; calibration and spurious noise issues may affect the calculation to some extent; the inflection at 325 ns is largely due to numerical issues with currents close to zero.

FIG. 9 shows a circuit model of the two switch halves. It is assumed for simplicity that the resistance of one side is the product of a scale factor and the resistance of the other switch half; that scale factor is allowed to vary as a function of time. If the current were shared perfectly, the scale factor would be unity. With current measured on both halves of the switch, and neglecting transit time between the switch halves (3.2 ns), the ratio of the two resistors can be found to be $$\alpha = \frac{I_1}{I_2} - \frac{1}{RI_2}\left[L_1\frac{dI_1}{dt} - L_2\frac{dI_2}{dt}\right]$$

where R is the nominal spark resistance on each side, $L_1$, $L_2$ are the switch half inductances, $\alpha$ is the resistance scale factor, and $I_1$, $I_2$ are the measured switch half currents. Current is observed to flow on both halves of the switch for the entire 500 ns full width of the output pulse. If the laser alignment is such that one side of the switch closes before the other, the first channel carries more current. The earliest channel to close carries proportionately more current later in time. The channels are expanding in diameter with time and Ohmically heated by the conducted current. FIG. 10 shows relative channel resistances for the two switch halves for the entire pulse duration.

Figure 11:
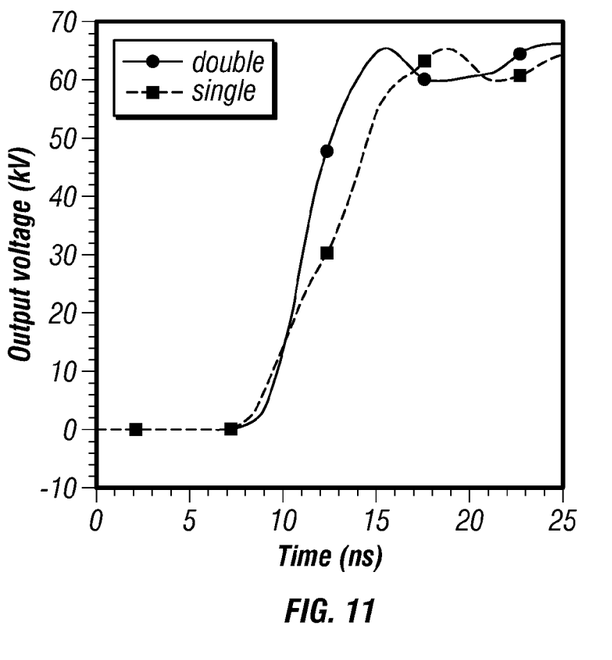
FIG. 11 is a graph of output voltage with normal two-channel operation, and with the laser focal point adjusted so that one side of the switch closes later than the other, so that 95% of the current flows on one side, effectively acting as a single channel switch; as expected, the rise time is shorter by nearly a factor of 2 with both channels; the shunt capacity of the nominally unused switch half in the single channel case may act to compensate the channel inductance and raise the output voltage above the level of a conventional single-sided switch; the tests were done at 77 kV charge.

FIG. 11 shows output voltage for normal dual channel operation, and for single channel operation induced by translating the laser focus so that one side carries more than 90% of the total current. The output rise time is 7.0 ns for single channel operation, and 4.4 ns for dual channel switching. The rise time is not exactly doubled for single channel operation because of channel resistance, and the compensating effect of the capacitance of the inactive side in single channel mode.

Figure 12:
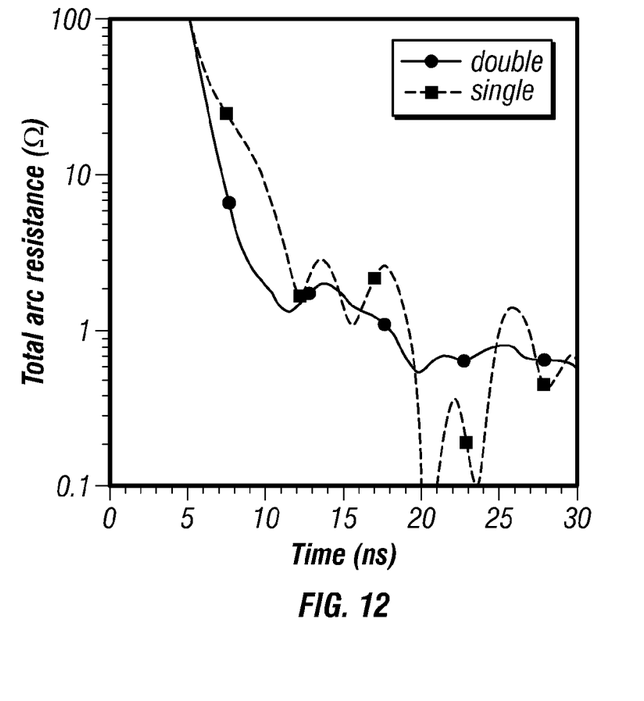
FIG. 12 is a graph of calculated resistance in normal mode with both sides conducting current, and with most of the current flowing on one side of the switch; displacement current to the inactive side of the switch affects the calculated single channel resistance at 20 ns.

FIG. 12 shows the calculated resistances for dual channel operation and single channel operation. The total resistance falls more quickly for two-channel operation, but again the plateau resistance is similar for the two cases.

Figure 13:
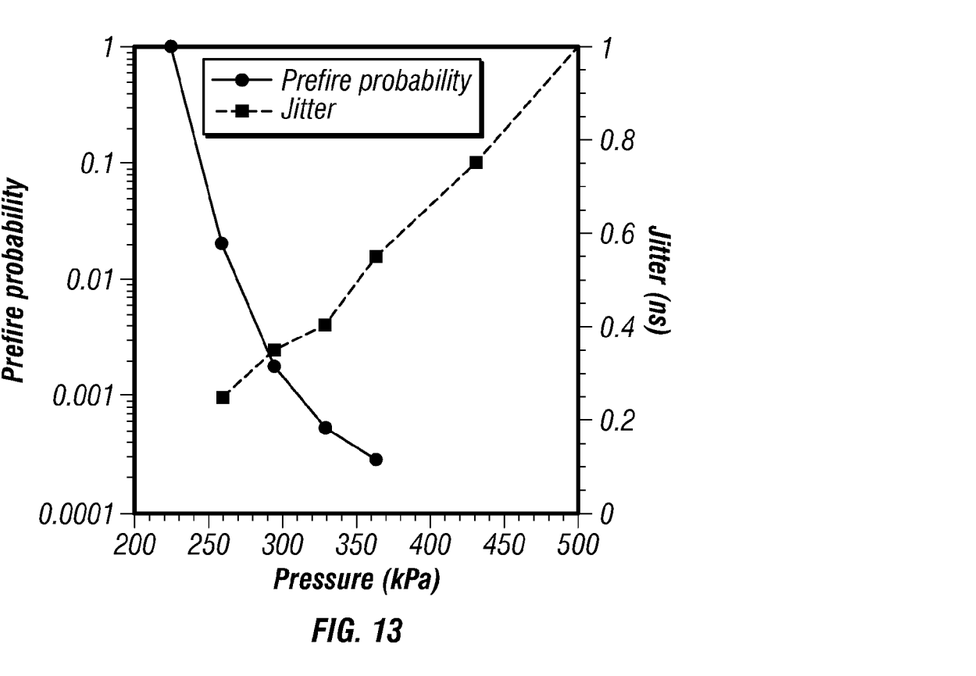
FIG. 13 is a graph of prefire probability and system jitter, versus switch pressure at 100 kV charge voltage; data are shown for pure $SF_6$; roughly 10,000 shots were acquired to generate this figure.
Figure 14:
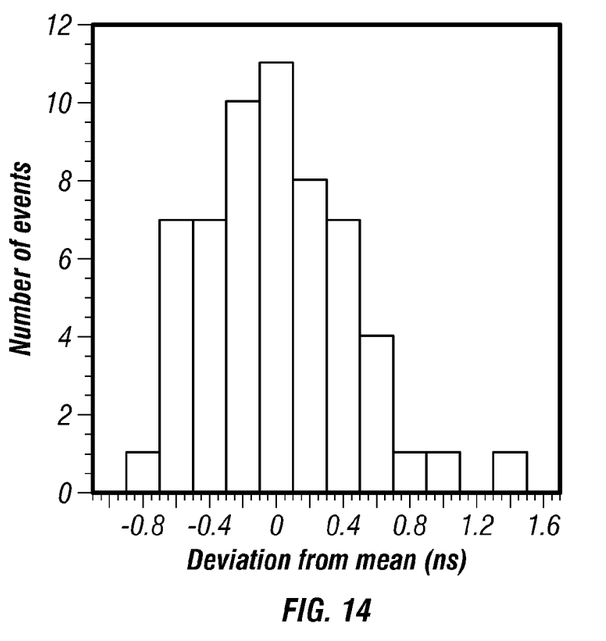
FIG. 14 is a histogram of pulse generator run time relative to the laser photodiode signal on full system shots of the Z facility; the 1 standard deviation in the timing is 430 ps; this includes digitizer uncertainty, which is of the order of 140 ps, at 200 ps per point sampling rate.
Figure 15:
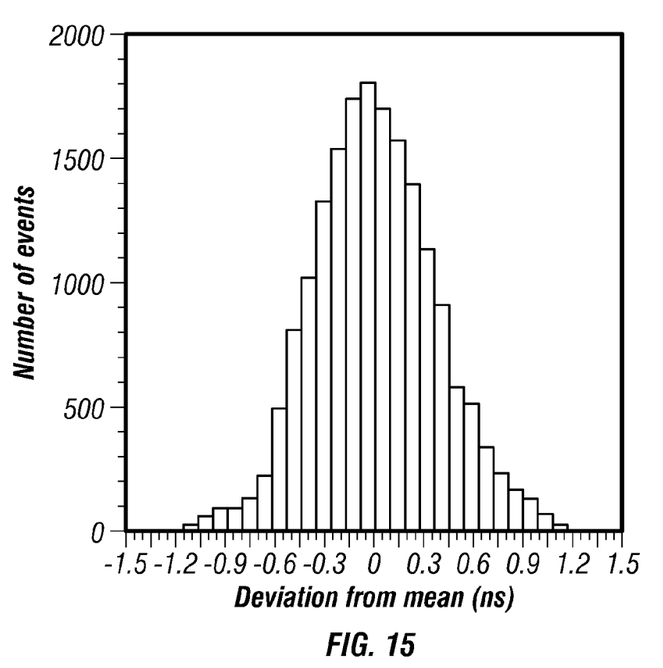
FIG. 15 is a histogram of jitter of the laser itself; deviation from the mean of measured 532 nm leakage light from the trigger laser relative to a fast-rising (100 ps) trigger signal; data are acquired on 18,000 consecutive laser-only shots, sampled at 20 ps per point; the 1-σ standard deviation of the laser output with respect to its trigger is 375 ps.

The pulser system was tested extensively in an unattended automated tester that performed a gas purge, set pressures and voltage levels, and charged and triggered the system. A voltage drop anytime before triggering was recorded as a prefire. The system recorded voltage and current derivative waveforms as well as laser energy from a calorimeter, and pressure and voltage of the system just before triggering. FIG. 13 shows the measured charge cycles between prefires as a function of switch pressure, and the 1 standard deviation timing jitter as a function of switch pressure. FIG. 14 shows a histogram of switch closure timing relative to the laser optical pulse on a continuous series of Z system shots. The timing standard deviation is 430 ps. The data sample time, $T_{sample}$, is 200 ps per point, which adds 140 ps one-sigma ($T_{sample}/\sqrt{2}$) uncertainty to the timing in quadrature. The result is an estimated 407 ps switch jitter. FIG. 15 shows a timing variation histogram for the laser alone. The timing one-sigma deviation of the laser itself is 375 ps. The net system timing uncertainty is therefore 553 ps at the normal operating pressure of 432 kPa and 100 kV charge, including the laser and the switch.

The present invention provides a laser-triggered high voltage pulse generator that drives a 5:56Ω resistive load with 80 kV, a 6 ns 10%-90% rise time, 550 ps jitter, and less than 104 misfire probability at the same time. The invention preferably uses a single optical path to initiate two spark channels. The system stores 117 J at 100 kV. The switch closure is initiated by 25 mJ of 266 nm laser light in a 3-5 ns FWHM pulse. The total system inductance (including switch, capacitors, output connections) is 14 nH, using a 300 mm diameter nearly uniform-field switch. The prefire probability of the switch has been studied extensively because of the critical need for a highly reliable system. The relatively low jitter and fast rise time are combined with a low prefire probability, to make a system that has been used effectively in a large pulsed-power driver as the primary trigger generator.

Note that in the specification and claims, "about" or "approximately" means within twenty percent (20%) of the numerical amount cited.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus for generating pulses, said apparatus comprising:
    a laser light source;
    a voltage electrode disposed between ground electrodes;
    laser spark gaps between said voltage electrode and said ground electrodes and within which laser sparks are generated by said laser light source; and
    one or more insulated ground output connectors connected to said voltage electrode and via which pulses are generated.

2. The apparatus of claim 1 wherein said apparatus is axisymmetric.

3. The apparatus of claim 2 wherein an on-axis laser beam activates said laser spark gaps.

4. The apparatus of claim 1 additionally comprising an isolating inductor supplied by two or more insulated ground connectors.

5. The apparatus of claim 1 additionally comprising a focal lens passing laser light to said laser spark gaps.

6. The apparatus of claim 5 wherein a focal lens length of said focal lens is between about 300 and 700 mm.

7. The apparatus of claim 1 wherein a thickness of said voltage electrode proximate said laser spark gaps is about 1 mm.

8. The apparatus of claim 1 wherein width of said laser spark gaps is about 7 mm.

9. The apparatus of claim 1 additionally comprising a ferromagnetic blocking core.

10. The apparatus of 1 wherein said apparatus has less than about a $10^{-4}$ misfire probability and about a 550 ps jitter or better.

11. A method for generating pulses, the method comprising the steps of:
    providing a laser light source;
    disposing a voltage electrode between ground electrodes;
    generating laser sparks using the laser light source via laser spark gaps between the voltage electrode and the ground electrodes; and
    outputting pulses via one or more insulated ground connectors connected to the voltage electrode.

12. The method of claim 11 wherein the result of the method is axisymmetric.

13. The method of claim 12 additionally comprising activating the laser spark gaps with an on-axis laser beam.

14. The method of claim 11 additionally comprising supplying two or more insulated ground connectors with an isolating inductor.

15. The method of claim 11 additionally comprising passing laser light to the laser spark gaps via a focal lens.

16. The method of claim 15 wherein a focal lens length of the focal lens is between about 300 and 700 mm.

17. The method of claim 11 wherein a thickness of the voltage electrode proximate the laser spark gaps is about 1 mm.

18. The method of claim 11 wherein width of the laser spark gaps is about 7 mm.

19. The method of claim 11 additionally comprising providing a ferromagnetic blocking core.

20. The method of 11 wherein the method provides a less than about a $10^{-4}$ misfire probability and about a 550 ps jitter or better.

* * * * *